US007705247B2

United States Patent
Kim et al.

(10) Patent No.: US 7,705,247 B2
(45) Date of Patent: Apr. 27, 2010

(54) BUILT-UP PRINTED CIRCUIT BOARD WITH STACK TYPE VIA-HOLES

(75) Inventors: Bong-Suck Kim, Busan (KR); Gye-Soo Kim, Busan (KR); Jong-Hyung Kim, Busan (KR); Il-Woon Shin, Busan (KR)

(73) Assignee: Samsung Electro-Mechanics Co., Ltd., Kyunggi-Do (KR)

(*) Notice: Subject to any disclaimer, the term of this patent is extended or adjusted under 35 U.S.C. 154(b) by 839 days.

(21) Appl. No.: 11/490,312

(22) Filed: Jul. 21, 2006

(65) Prior Publication Data

US 2007/0039753 A1    Feb. 22, 2007

Related U.S. Application Data

(62) Division of application No. 10/603,764, filed on Jun. 26, 2003, now Pat. No. 7,152,318.

(30) Foreign Application Priority Data

Dec. 12, 2002    (KR) ................. 2002-79216

(51) Int. Cl.
H01R 12/04    (2006.01)
H05K 1/11    (2006.01)

(52) U.S. Cl. .................... 174/264; 361/792
(58) Field of Classification Search ......... 174/264–266, 174/262–263; 361/792–795
See application file for complete search history.

(56) References Cited

U.S. PATENT DOCUMENTS

| 5,883,335 A | 3/1999 | Mizumoto et al. | 174/266 |
| 5,956,843 A | 9/1999 | Mizumoto et al. | 29/852 |
| 6,240,636 B1 | 6/2001 | Asai et al. | 29/852 |
| 6,452,117 B2 * | 9/2002 | Curcio et al. | 174/262 |
| 6,660,811 B2 | 12/2003 | Ogura et al. | 525/523 |

* cited by examiner

*Primary Examiner*—Jeremy C Norris
(74) *Attorney, Agent, or Firm*—Morgan Lewis & Bockius LLP

(57) ABSTRACT

A built-up printed circuit board includes stacked micro via-holes, each of which is provided for interconnection between layers in the printed circuit board, and in each of which a filling material, such as liquefied resin or conductive paste, is filled using a poly screen of a general screen printing machine.

5 Claims, 25 Drawing Sheets

64

66

65

65

67

BUILT-UP PRINTED CIRCUIT BOARD WITH STACK TYPE VIA-HOLES

This is a Divisional of U.S. application Ser. No. 10/603,764, filed Jun. 26, 2003, now U.S. Pat. No. 7,152,318 which is hereby incorporated by reference.

BACKGROUND OF THE INVENTION

1. Field of the Invention

The present invention relates to a built-up printed circuit board with stacked via-holes, and more particularly to a built-up printed circuit board having stacked micro via-holes formed therethrough, each of which is provided for interconnection between layers in the printed circuit board manufactured by a build-up process, and in each of which liquefied resin or conductive paste is filled. The present invention also relates to a method for manufacturing such a built-up printed circuit board with stacked via-holes.

2. Description of the Related Art

As well known to those skilled in the art, an inter-layer structure of a multi-layered printed circuit board has become more complicated in recent years as electronic appliances have become smaller and thinner, and yet have higher density. Also, it is required to develop a method for performing electrical conduction between layers in a high-density wiring printed circuit board to carry out a high-speed signal process in such a small-sized (light, thin, and small) electronic appliance.

In the case of a built-up printed circuit board, micro via-holes, i.e., blind via-holes are formed through the built-up printed circuit board for performing selective electrical conduction between layers in the built-up printed circuit board.

The micro via-holes generally include staggered via-holes, O-ring via-holes, and stacked via-holes.

FIGS. 1a and 1b are cross sectional views of staggered micro via-holes and O-ring micro via-holes, respectively.

In the case of the staggered micro via-holes as shown in FIG. 1a, a via-hole is first formed on a thin copper layer 1 by means of a laser drill, and a plated layer 2 is formed on the via-hole and the thin cooper layer 1. Subsequently, another via-hole is formed on the plated layer 2 in a vicinity of the first formed via-hole.

In the case of the O-ring micro via-holes as shown in FIG. 1b, a via-hole is first formed on a thin copper layer 1 by means of a laser drill, and then another via-hole having a diameter larger than that of the first formed via-hole is concentrically formed around the first formed via-hole.

FIGS. 2a to 2c are cross sectional views of various kinds of stacked micro via-holes, respectively. FIG. 2a shows stacked micro via-holes filled with copper, FIG. 2b shows stacked micro via-holes filled with resin or paste, and FIG. 2c shows stacked micro via-holes formed by copper bumps. A "via on via" technology, which provides stacked via-holes comprising a via-hole formed on another via-hole, is one of technologies applicable to all future printed circuit boards. The "via on via" technology is now under further improvement in various ways by several manufacturers of printed circuit boards.

Technologies for stacking micro via-holes formed by means of the laser drill generally include a method for filling copper into the micro via-holes, and AGP and NMBI (Neo Manhattan Bump Interconnection) methods for forming copper bumps, respectively. Especially, the NMBI method, on which North Corporation in Japan has a patent right, is a leading-edge technology for interconnecting interlayer signals in a multi-layered printed circuit board by means of copper bumps instead of the laser drill. However, the aforesaid technologies require investment in large-scale facilities, are not adaptable to produce the printed circuit boards in large quantities due to disparities between the manufacturing processes of these technologies and the existing standardized manufacturing process, and do not appropriately utilize the existing facilities, which requires vast investment in new large-scale facilities.

FIGS. 3a to 3g are cross sectional views respectively showing consecutive steps of a conventional method for manufacturing a built-up printed circuit board comprising the steps of filling via-holes using a copper plating process, and stacking the via-holes filled with the copper.

On first thin copper layers 23, each of which has a circuit pattern formed thereon, are first formed first insulating layers 24 made of film-shaped resin coated clad (RCC) or thermally curable (TC) resin, as shown in FIG. 3a. The first thin copper layers 23 are formed on the top and bottom surfaces of prepreg 21, respectively. Each of the first thin copper layers 23 has a prescribed circuit pattern formed thereon by means of an etching process.

Second, a plurality of micro via-holes 25 are formed through the first insulating layers 24 to the first thin copper layers 23 by means of a laser drill, as shown in FIG. 3b. A $CO_2$ laser or an Nd-YAG laser may be used for forming the micro via-holes.

Third, via-hole filling copper plated layers 26 are formed on the micro via-holes 25, as shown in FIG. 3c. At the same time, the copper plated layers 26 are also formed on the first insulating layers 24, and a circuit pattern is formed on each of the copper plated layers 26 above the micro via-holes by means of an etching process.

Fourth, second insulating layers 27, which are made of film-shaped resin coated clad (RCC) or thermally curable (TC) resin, are formed on the copper plated layers 26 having circuit patterns formed thereon, respectively, as shown in FIG. 3d.

Fifth, a plurality of micro via-holes 28 are formed through the second insulating layers 27 to the copper plated layers 26 by means of the laser drill, as shown in FIG. 3e. Subsequently, via-hole filling copper plated layers 29 are formed on the micro via-holes 28 and on the second insulating layers 27, as shown in FIG. 3f.

Finally, a circuit pattern is formed on each of the copper plated layers 29 above the micro via-holes 28 by means of an etching process, as shown in FIG. 3g.

As described above, a multi-layered printed circuit board is manufactured by repeatedly building up different printed circuit board units.

FIGS. 4 to 6 are cross sectional views respectively illustrating several problems raised in forming micro via-holes according to the conventional art.

As shown in FIG. 4, an air void 44 may be formed in a micro via-hole 43 when a via-hole filling copper plated layer 42 is formed on a thin copper layer 41 (Refer to FIGS. 3c and 3f).

As shown in FIG. 5, a micro via-hole 49, which is supposed to be concentrically formed above another micro via-hole 47, may deviate from the micro via-hole 47 at a interlayer eccentric distance A, by which electrical interconnection between layers in the multi-layered printed circuit board may be cut off.

As shown in FIG. 6, a dimple 54 may be formed in a micro via-hole 53 when a via-hole filling copper plated layer 52 is formed on a thin copper layer 51. The level of the copper plated layer 52 on the micro via-hole 53 is different from that of the cooper plated layer 52 in a vicinity of the micro via-hole 53 because of the dimple 54.

FIGS. 7a to 7d are photographs respectively showing the aforesaid problems mentioned with reference to FIGS. 4 to 6.

FIG. 7a shows a micro via-hole 62 formed on a copper plated layer 61 after another micro via-hole is filled with the copper, and FIG. 7b shows the micro via-hole filled with copper of FIG. 7a in detail. It can be seen from FIGS. 7a and 7b that the stacked micro via-holes deviate from each other.

FIG. 7c shows that an air void 63 is formed in a micro via-hole after the micro via-hole has been filled with copper. It can be seen from FIG. 7c that the via-hole is not completely filled with the copper because of the air void 63.

FIG. 7d shows that a dimple 64 is formed in a micro via-hole after the micro via-hole has been filled with copper. It can be seen from FIG. 7d that the level of a copper plated layer on the micro via-hole is different from that of the cooper plated layer in a vicinity of the micro via-hole because of the dimple 64.

In the aforesaid build-up process for manufacturing the printed circuit board, the micro via-hole is formed by means of the laser drill, and the micro via-hole is filled with the copper. At this time, a new plating process is added to the build-up process, which increases the cost of manufacturing the printed circuit board.

SUMMARY OF THE INVENTION

Therefore, the present invention has been made in view of the above problems, and it is an object of the present invention to provide a built-up printed circuit board with stacked via-holes, which can be manufactured without the provision of new facilities and can be easily controlled in a process, and a method for manufacturing such a built-up printed circuit board with stacked via-holes.

It is another object of the present invention to provide a built-up printed circuit board with stacked via-holes, which is light, thin, and small, and yet has high density, and a method for manufacturing such a built-up printed circuit board with stacked via-holes.

It is another object of the present invention to provide a built-up printed circuit board with stacked via-holes, which can be economically manufactured, and a method for manufacturing such a built-up printed circuit board with stacked via-holes.

It is another object of the present invention to provide a built-up printed circuit board with stacked via-holes, which can be easily filled regardless of the size and the thickness of the printed circuit board, and the number, the size, and the depth, and the shape of the via-holes, and a method for manufacturing such a built-up printed circuit board with stacked via-holes.

It is yet another object of the present invention to provide a built-up printed circuit board with stacked via-holes, in which photosensitive photo solder resist does not sink and no air void is formed even using a general screen printing machine, and a method for manufacturing such a built-up printed circuit board with stacked via-holes.

In accordance with one aspect of the present invention, the above and other objects can be accomplished by the provision of a method for manufacturing a built-up printed circuit board with stack type via-holes, comprising the steps of: (a) forming a first via-hole through a first laminated copper sheet by means of a laser drill; (b) forming a first plated layer on the first via-hole and on the first laminated copper sheet; (c) filling the first plated via-hole with a via-hole filling material; (d) grinding the top surface of the first via-hole filled with the via-hole filling material to level the first via-hole; (e) forming a second plated layer on the first filled via-hole and the first plated layer to cover the first filled via-hole; and (f) disposing a second laminated copper sheet on the second plated layer, and repeating the steps (a) to (e) to form a second via-hole.

Preferably, the laser may be a $CO_2$ laser or an Nd-YAG laser.

Preferably, the first and second plated layers may be formed by means of P/N plating (CAP plating).

Preferably, the via-hole filling material may be filled in the via-hole by a general screen printing process.

Preferably, a portion of a poly screen corresponding to the via-hole is opened so that the via-hole filling material passes through the opened portion to fill only the via-hole during the screen printing.

Preferably, the via-hole filling material may be liquefied insulating resin or conductive paste.

Preferably, the conductive paste may be copper paste or silver paste.

Preferably, a viscosity of the via-hole filling material is not more than 100 dPa·s.

Preferably, the grinding step may be carried out by a grinder made of ceramic buff, scotch buff, highcut buff, or belt.

In accordance with another aspect of the present invention, there is provided a method for manufacturing a built-up printed circuit board with stack type via-holes, comprising the steps of: (a) forming a first via-hole through a first laminated copper sheet by means of a laser drill; (b) forming a first plated layer on the first via-hole and on the first laminated copper sheet; (c) filling the first plated via-hole with a via-hole filling material; (d) grinding the top surface of the first via-hole filled with the via-hole filling material to level the first via-hole; (e) forming a second plated layer on the first leveled via-hole and the first plated layer to cover the first leveled via-hole; (f) disposing a second laminated copper sheet on the second plated layer, (g) forming a second via-hole through the second laminated copper sheet by means of the laser drill; (h) filling the second via-hole with another via-hole filling material; (i) grinding the top surface of the second via-hole filled with the via-hole filling material to level the second via-hole; and (j) forming a third plated layer on the second leveled via-hole and the second laminated copper sheet to cover the second leveled via-hole, and forming a circuit pattern on the third plated layer.

Preferably, a viscosity of the via-hole filling material may be not more than 100 dPa·s.

Preferably, the filling step of filling the via-hole with the via-hole filling material may be carried out using a general screen printing machine.

Preferably, the screen printing machine may have a screen of not more than 250 mesh of a poly or stainless steel (SUS) sheet.

Preferably, the screen printing machine may have a rubber squeegee spreading speed of not more than 150 mm/sec.

Preferably, the method according to the present invention may further comprise: firstly drying the printed circuit board at a low temperature of 60 to 80° C. for 15 to 30 minutes; and secondly drying the printed circuit board at a high temperature of 140 to 160° C. for 30 to 60 minutes, wherein the first and second drying steps are carried out after the filling step of filling the via-hole with the via-hole filling material.

Preferably, the via-hole formed by the laser drill may have a diameter of 50 μm to 200 μm.

In accordance with yet another aspect of the present invention, there is provided a built-up printed circuit board with stack type via-holes, comprising: a plurality of first via-holes formed through a first laminated copper sheet by means of a laser drill; a first plated layer formed on the first via-holes and the first laminated copper sheet; a filling material filled in each of the first plated via-holes; a second plated layer formed on the first filled via-holes and the first plated layer to cover the first filled via-holes; a plurality of second laminated copper sheets disposed on the second plated layer, respectively; and a plurality of second via-holes formed through the second laminated copper sheets by means of the laser drill.

According to the present invention, the micro via-hole is formed by means of the laser drill, the liquefied insulating resin or the conductive paste is filled only in the micro via-hole by a screen printing process, and another micro via-hole is stacked on the macro via-hole filled with the liquefied insulating resin or the conductive paste.

BRIEF DESCRIPTION OF THE DRAWINGS

The above and other objects, features and other advantages of the present invention will be more clearly understood from the following detailed description taken in conjunction with the accompanying drawings, in which.

DESCRIPTION OF THE PREFERRED EMBODIMENTS

Figure 1A:
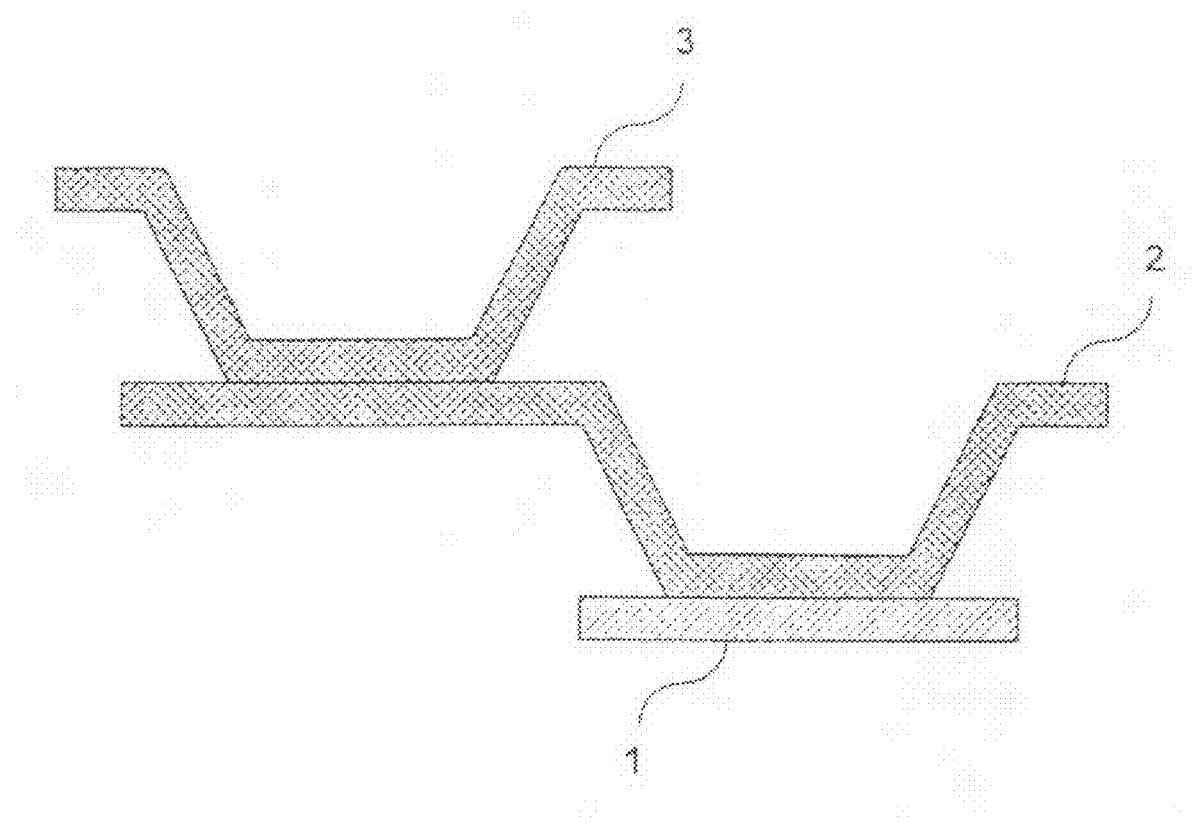
FIGS. 1a and 1b are cross sectional views of staggered micro via-holes and O-ring micro via-holes, respectively.
Figure 1B:
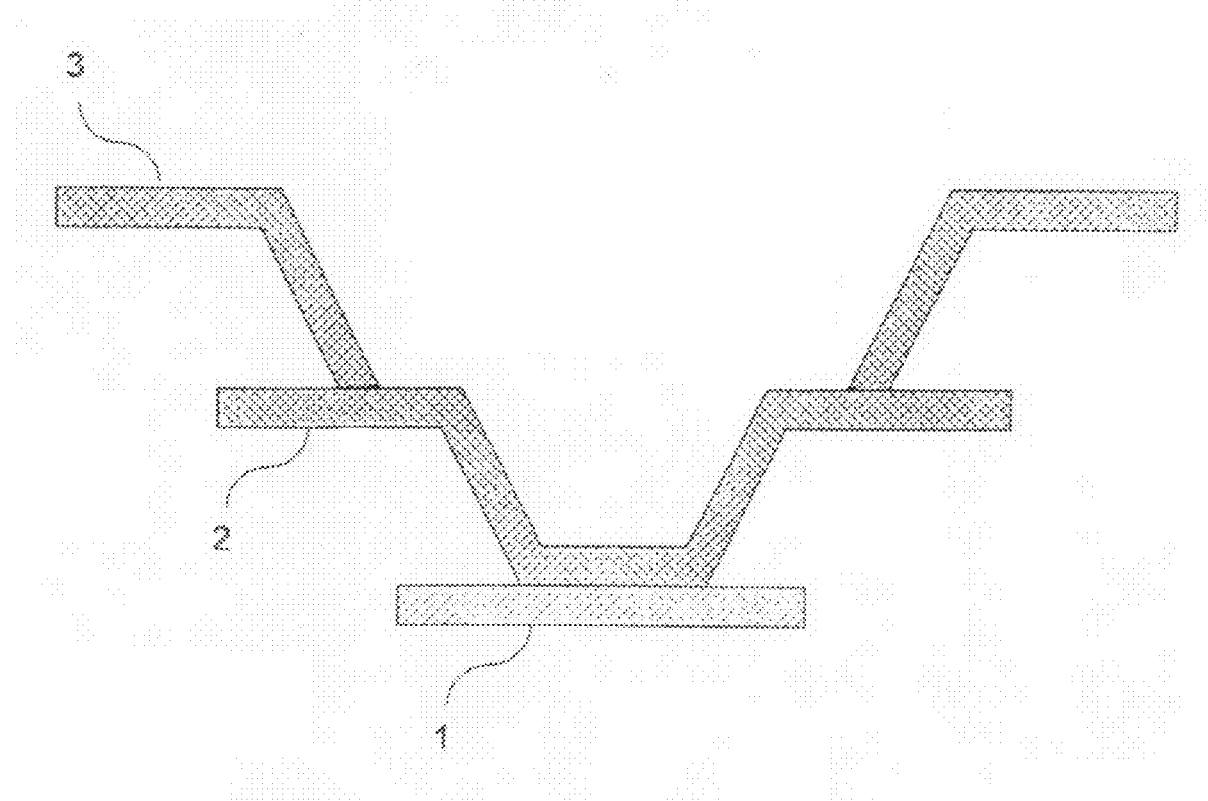
Figure 2A:
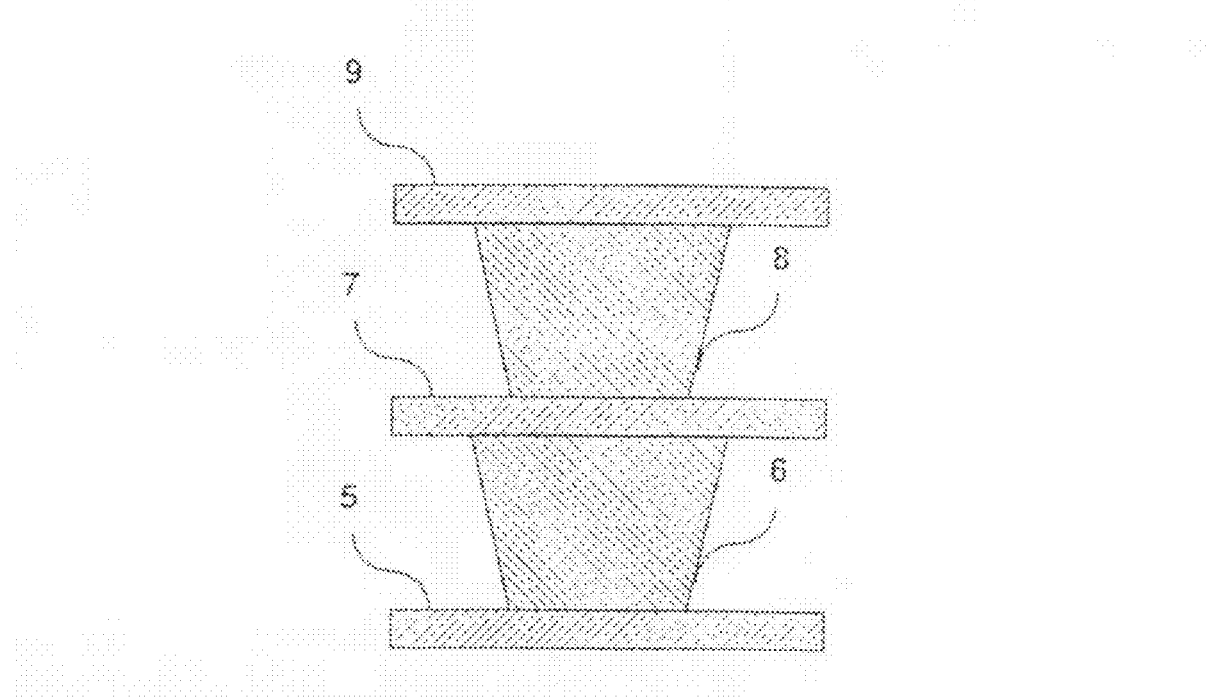
FIGS. 2a to 2c are cross sectional views of various kinds of stacked micro via-holes, respectively, showing stacked micro via-holes filled with copper plated layers (FIG. 2a), stacked micro via-holes filled with resin or paste (FIG. 2b), and stacked micro via-holes formed by copper bumps (FIG. 2c)
Figure 2B:
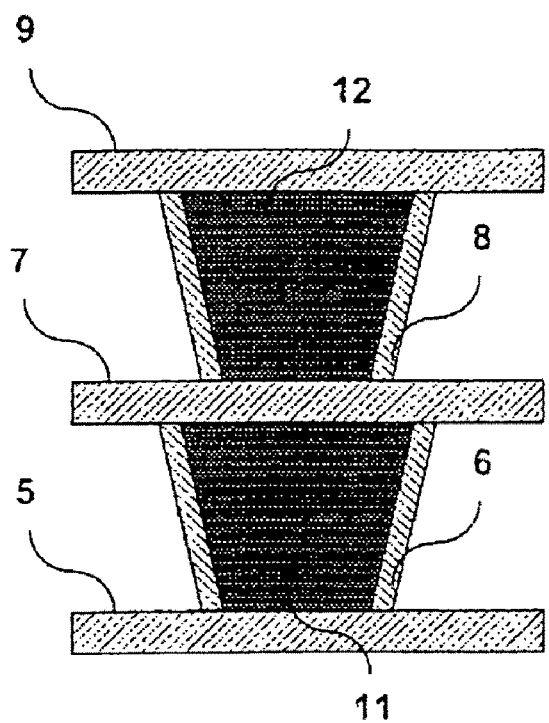
Figure 2C:
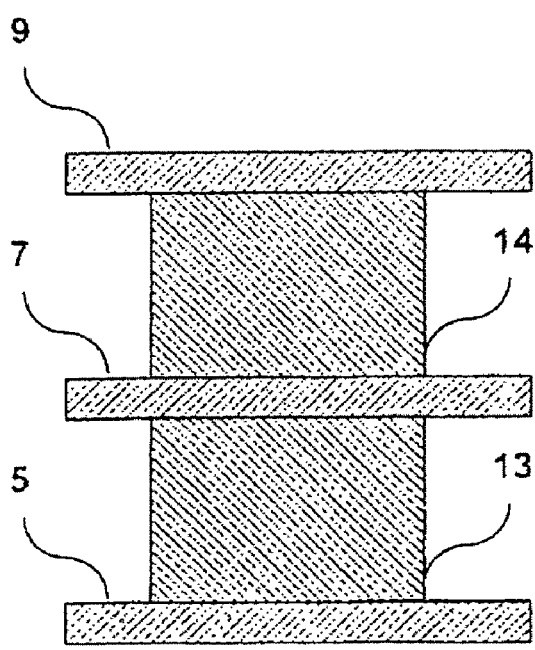
Figure 3A:
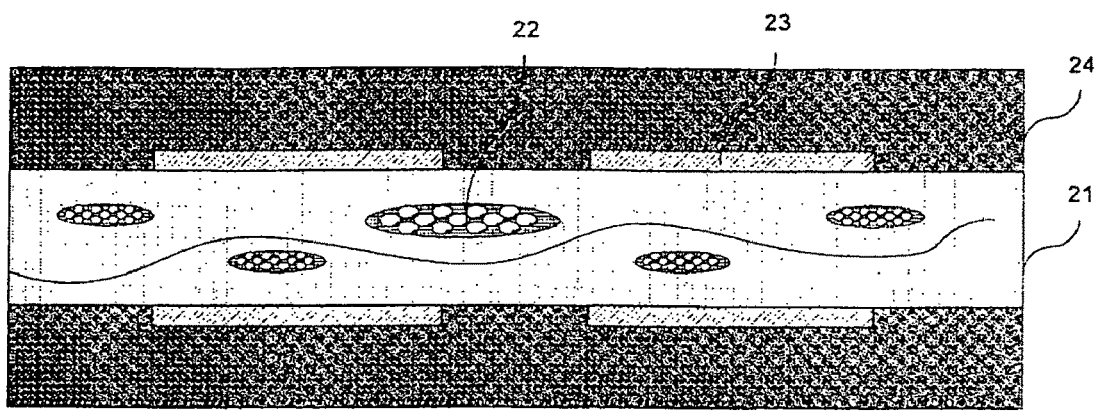
FIGS. 3a to 3g are cross sectional views respectively showing consecutive steps of a conventional method for manufacturing a built-up printed circuit board comprising the steps of filling via-holes using a copper plating process, and stacking the via-holes filled with the copper.
Figure 3B:
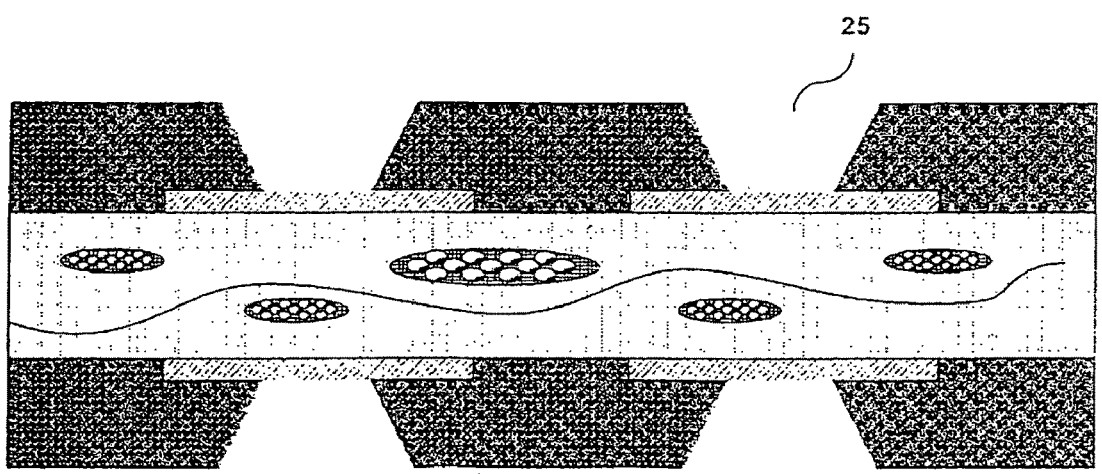
Figure 3C:
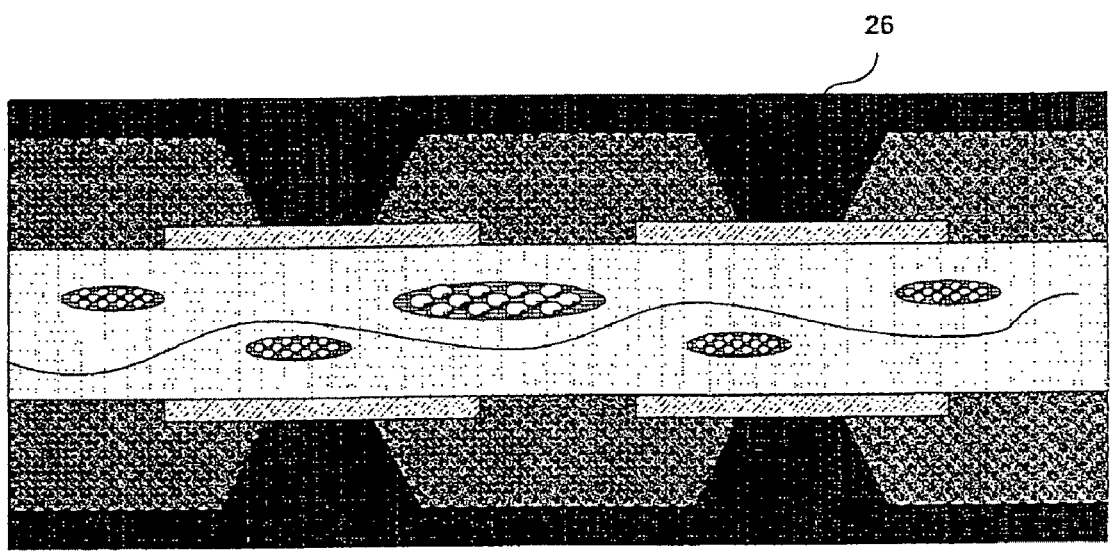
Figure 3D:
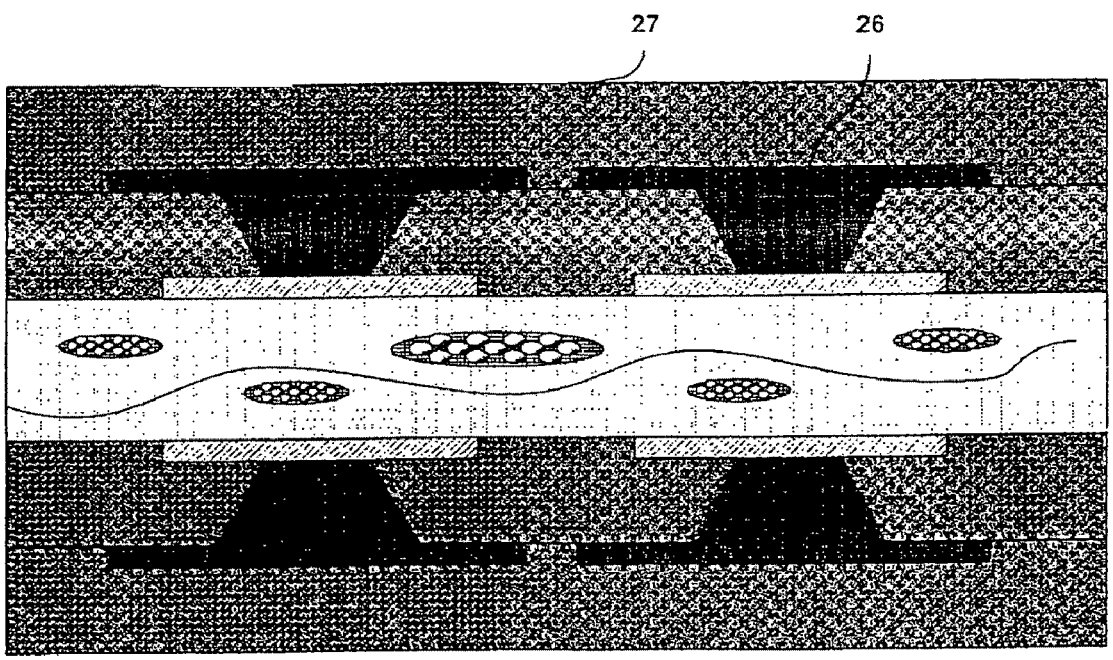
Figure 3E:
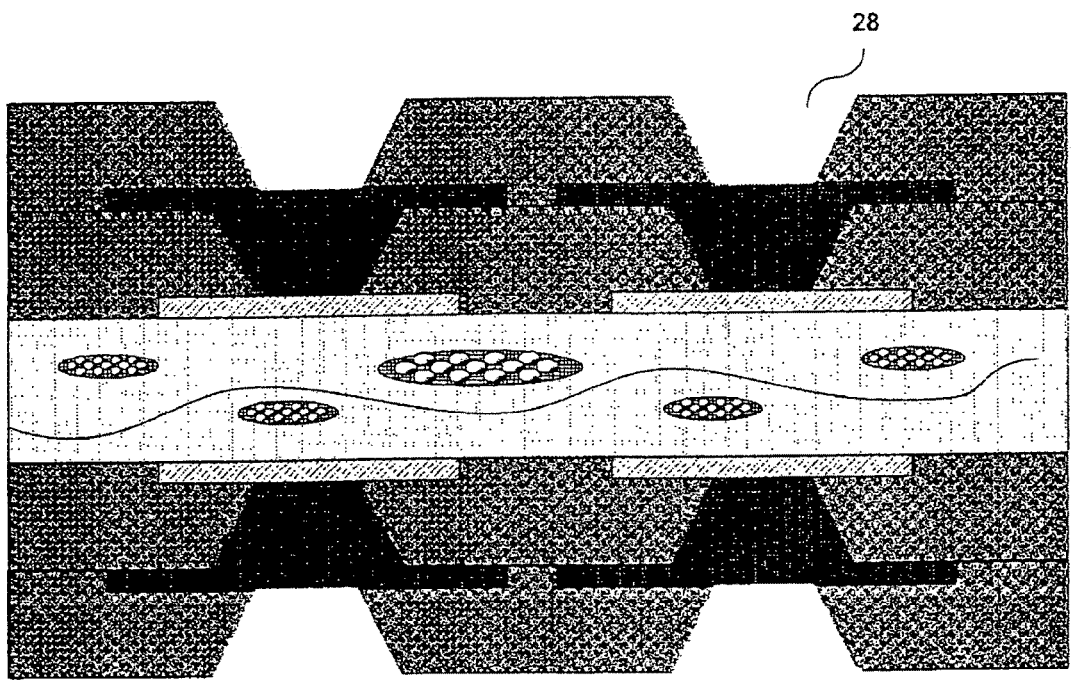
Figure 3F:
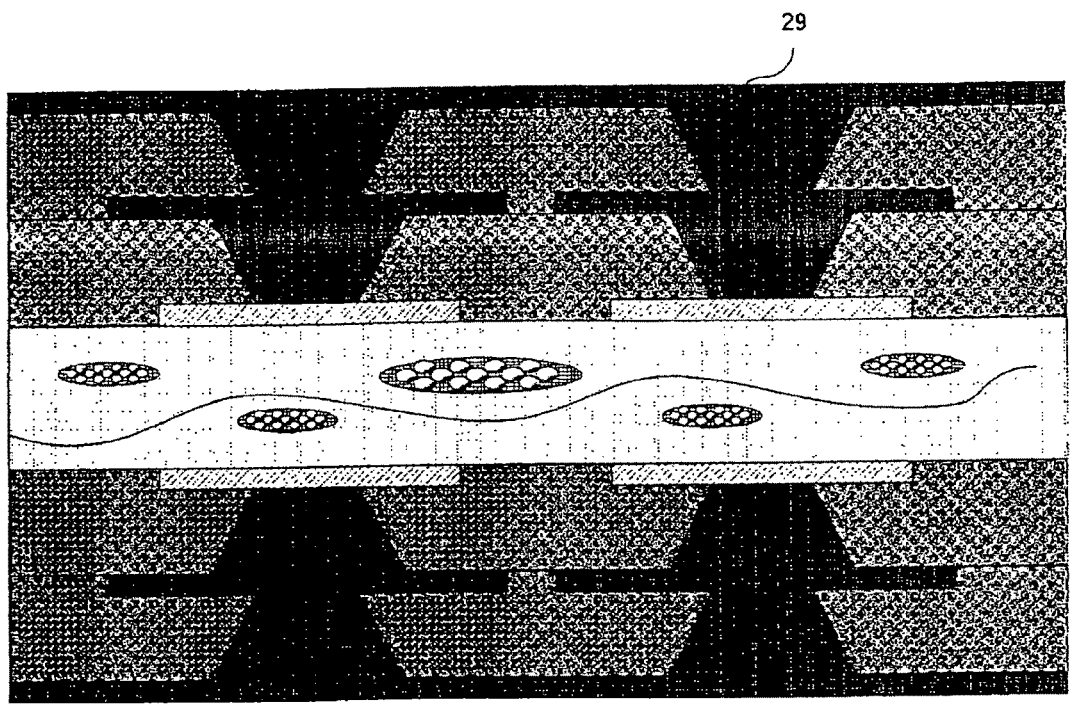
Figure 3G:
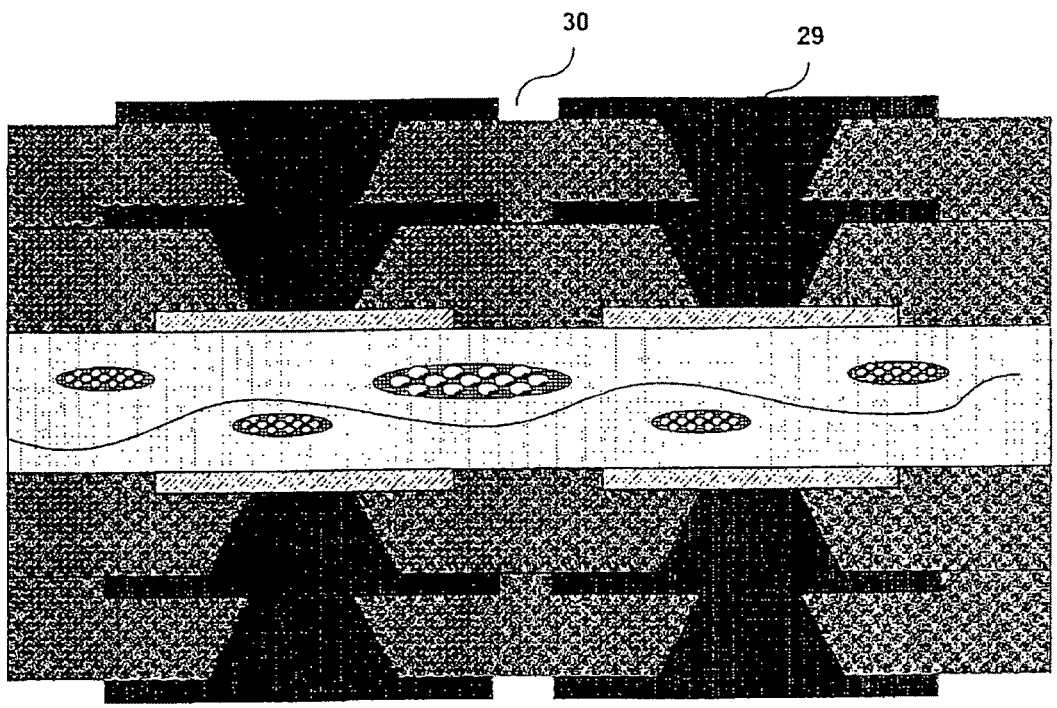
Figure 4:
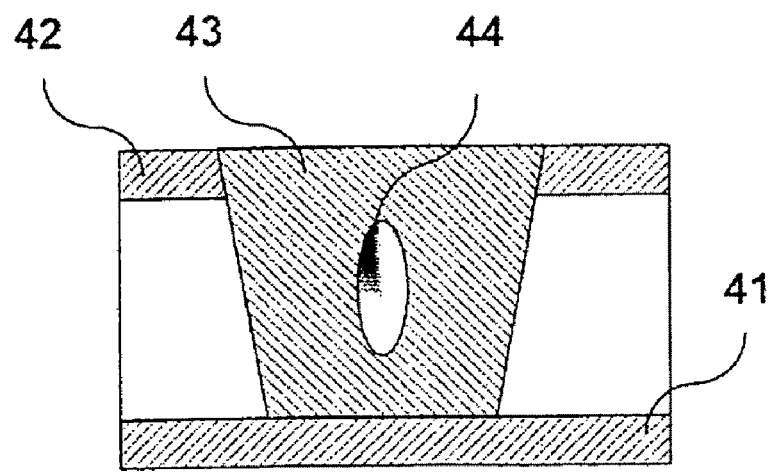
FIGS. 4 to 6 are cross sectional views respectively illustrating several problems raised in forming micro via-holes according to the conventional art.
Figure 5:
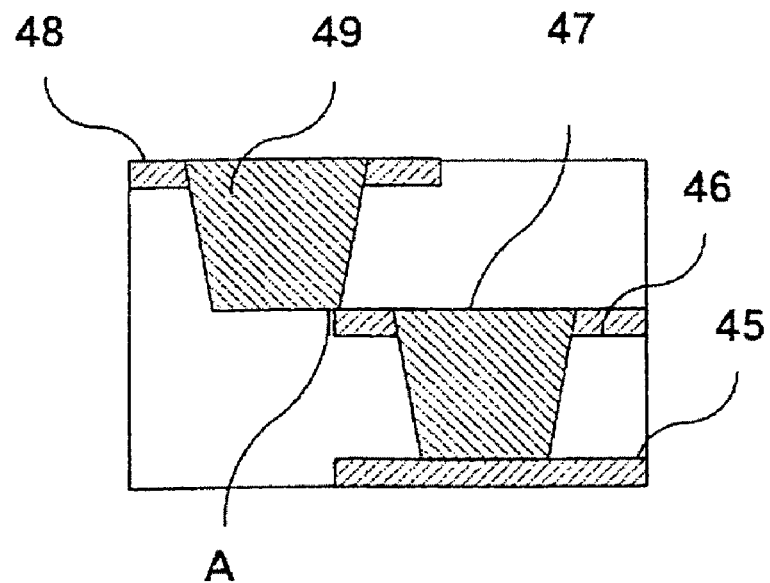
Figure 6:
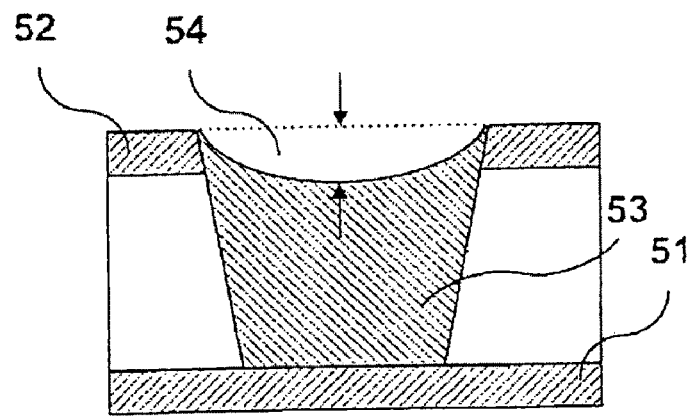
Figure 7A:
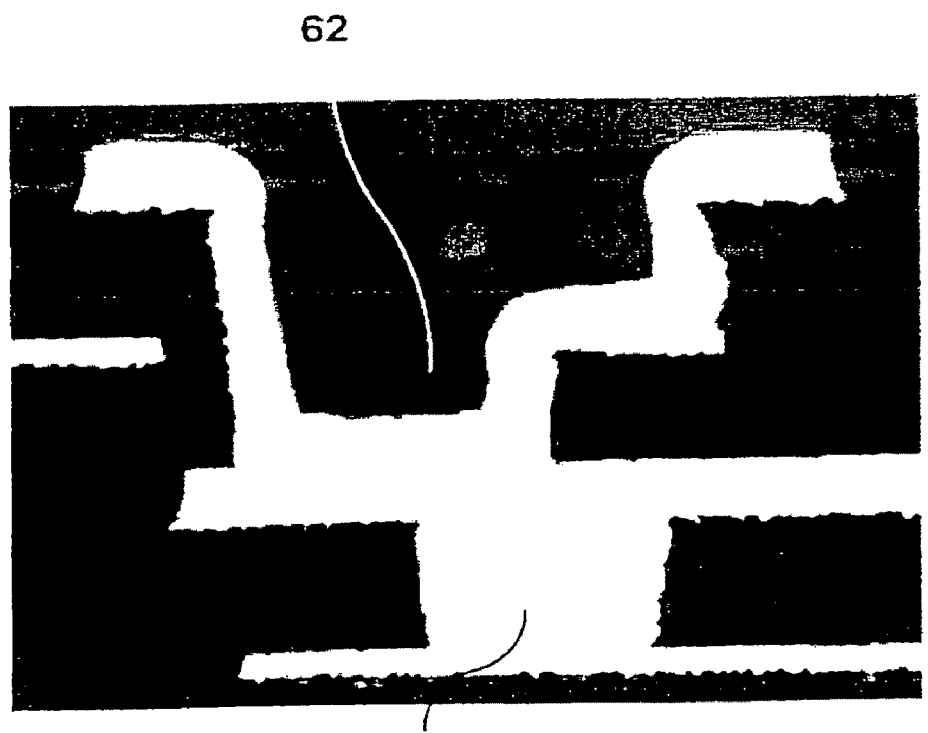
FIGS. 7a to 7d are photographs respectively showing several problems raised in forming micro via-holes according to the conventional art.
Figure 7B:
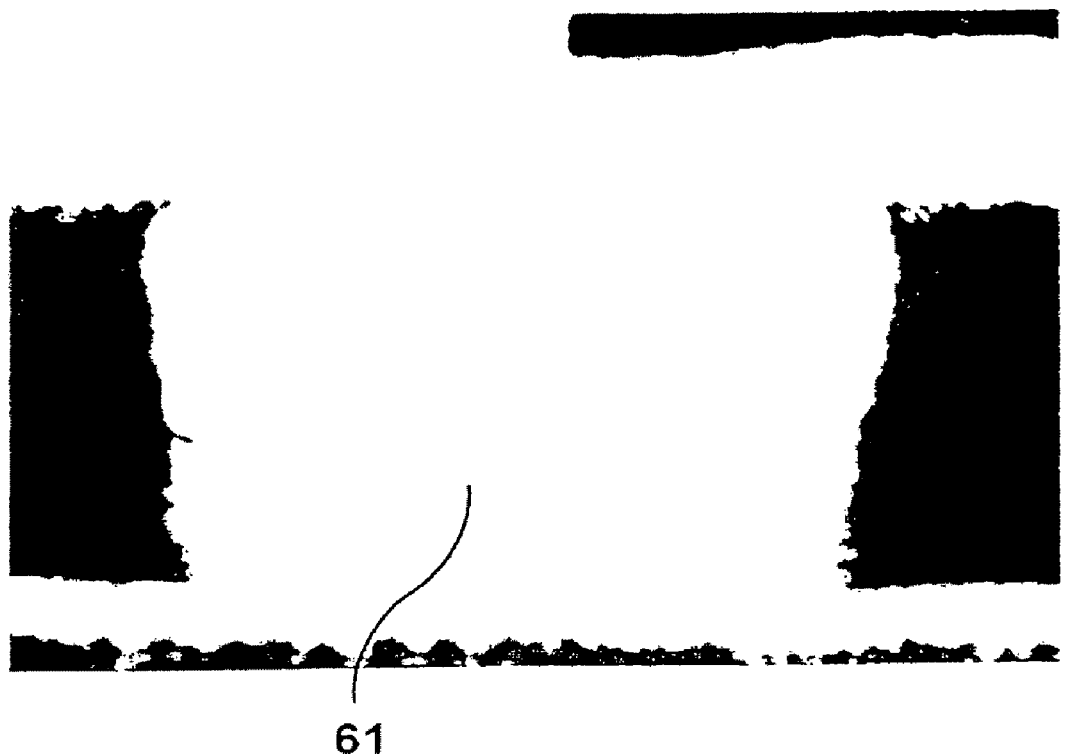
Figure 7C:
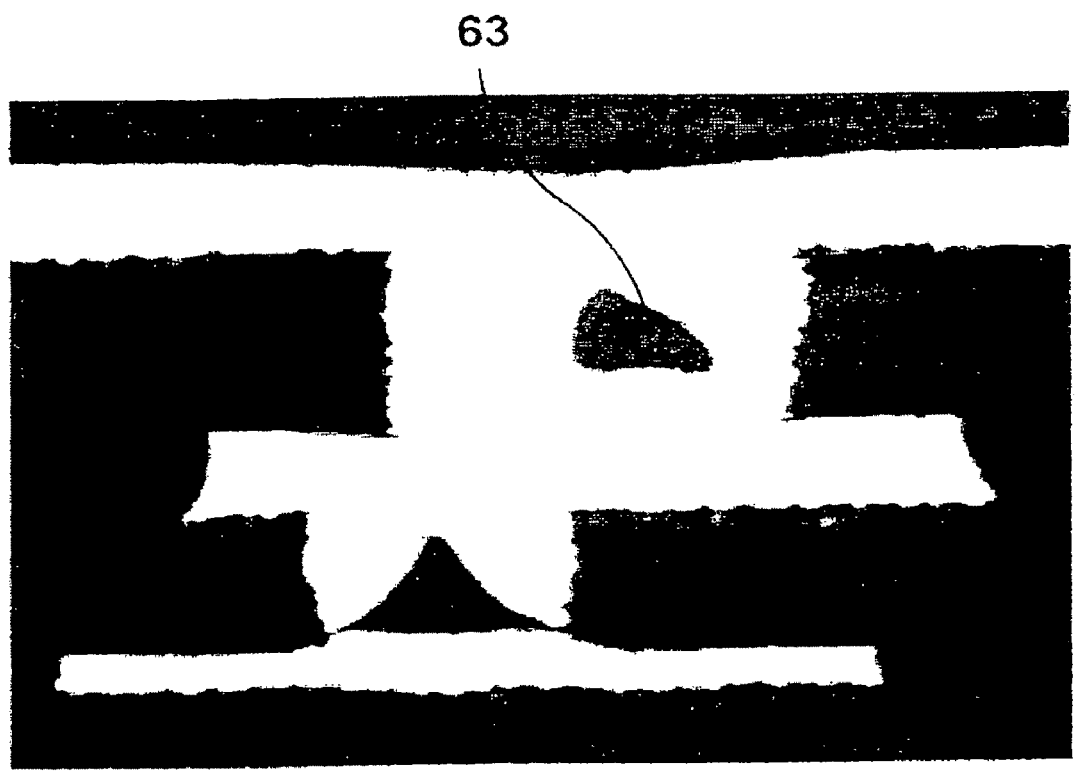
Figure 7D:
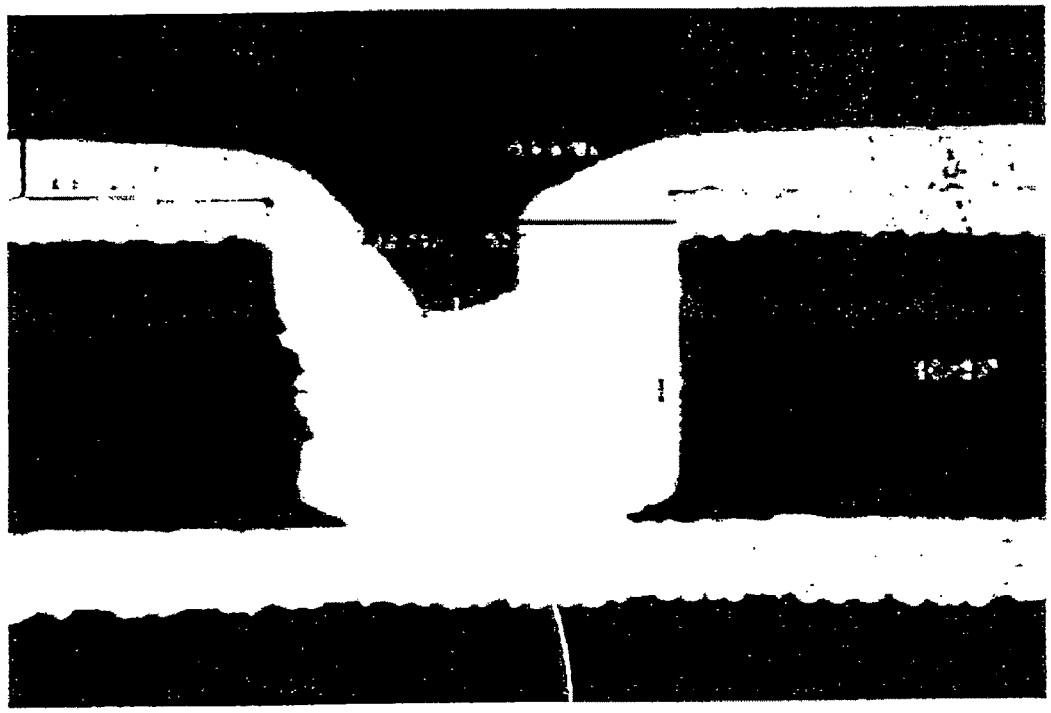
Figure 8:
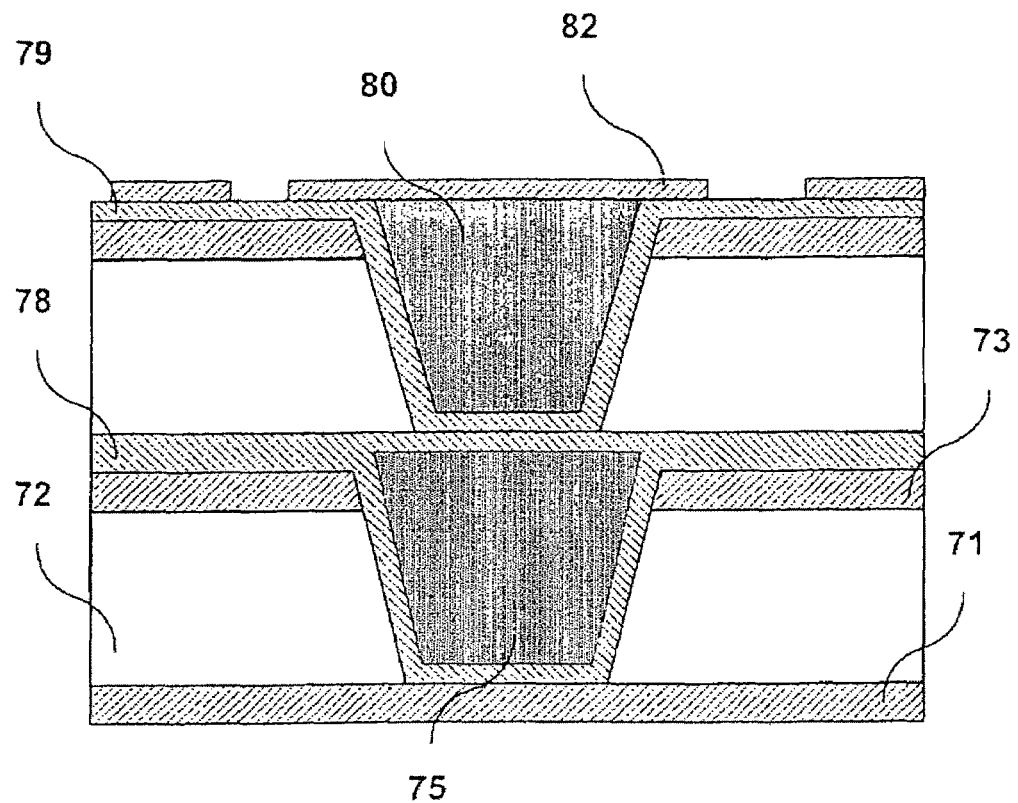
FIG. 8 is a cross sectional view of a printed circuit board manufactured by a build-up process according to the present invention.

FIG. 8 is a cross sectional view of a printed circuit board manufactured by a build-up process according to the present invention.

As shown in FIG. 8, the built-up printed circuit board with stacked via-holes comprises: a first via-hole formed through a first laminated copper sheet 72 by means of a laser drill; a first plated layer 74 formed on the first via-hole and a thin copper layer 73 attached on the first laminated copper sheet 72; a filling material 75 filled in the first plated via-hole; a second plated layer 78 formed on the first via-hole filled with the filling material and the first plated layer 74 to cover the first filled via-hole, a second laminated copper sheet disposed on the second plated layer 78, and a second via-hole formed through the second laminated copper sheet by means of the laser drill.

The built-up printed circuit board with stacked via-holes as shown in FIG. 8 is manufactured as follows:

Micro via-holes are formed through a laminated copper sheet 72 with thin copper layers 71 and 73 attached thereon by means of a laser drill, and a copper plated layer 74 is formed on the micro via-holes and the thin copper layer 73 attached on the laminated copper sheet 72. Next, the micro via-holes are filled with a filling material 75, such as liquefied insulating resin or conductive paste (copper paste or silver paste), by a screen printing process, not with copper as in the conventional art.

Subsequently, the top surface of the via-hole filled with the filling material 75 is ground so that the top surface of the via-hole filled with the filling material 75 is leveled, and a plated layer 78 is formed on the leveled via-hole and the copper plated layer 74 by P/N plating (CAP plating). Thereafter, another laminating process is carried out so that another layer is stacked on the aforesaid layer, and then a subsequent process, such as laser drilling and filling by screen printing, is repeatedly carried out so that stacked micro via-holes are formed. After the aforesaid stacked micro via-holes are formed, a circuit pattern 82 is formed. Consequently, the built-up printed circuit board with stacked via-holes is finally manufactured.

Before not only the first via-holes are filled with the filling material 75 but also another via-holes are filled with the filling material 80, the P/N plating (CAP plating) is carried out respectively for interconnection between layers in the multi-layered printed circuit board. After the P/N plating (CAP plating) is carried out, the via-holes are filled with the liquefied insulating resin or the conductive paste. Subsequently, the top surfaces of the via-holes filled with the liquefied insulating resin or the conductive paste are ground, and then another CAP plating process is carried out. At this time, the filling materials are filled in the via-holes using a general screen printing machine, not a vacuum screen printing machine. A portion of a poly screen of the screen printing machine corresponding to the via-hole is opened so that the via-hole filling material passes through the opened portion to fill only the via-hole during the screen printing.

A method for manufacturing the printed circuit board by the build-up process, which has been previously described in brief with reference to FIG. 8, will now be described in more detail with reference to FIGS. 9a to 9h.

FIGS. 9a to 9h are cross sectional views respectively showing consecutive steps of the method for manufacturing the printed circuit board by the build-up process according to the present invention.

Figure 9A:
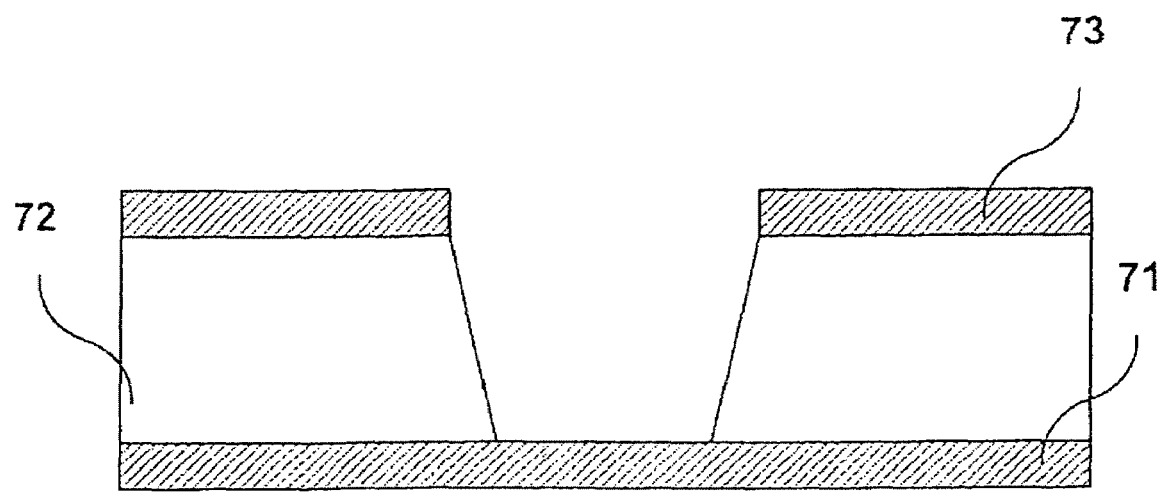
FIGS. 9a to 9h are cross sectional views respectively showing consecutive steps of a method for manufacturing a printed circuit board using a build-up process according to the present invention.

First, a first via-hole is formed through a first laminated copper sheet 72, which is provided at the top and bottom surfaces thereof with thin copper layers 71 and 73, respectively, by means of a laser drill, such as a $CO_2$ laser drill or an Nd-YAG laser drill, as shown in FIG. 9a.

Figure 9B:
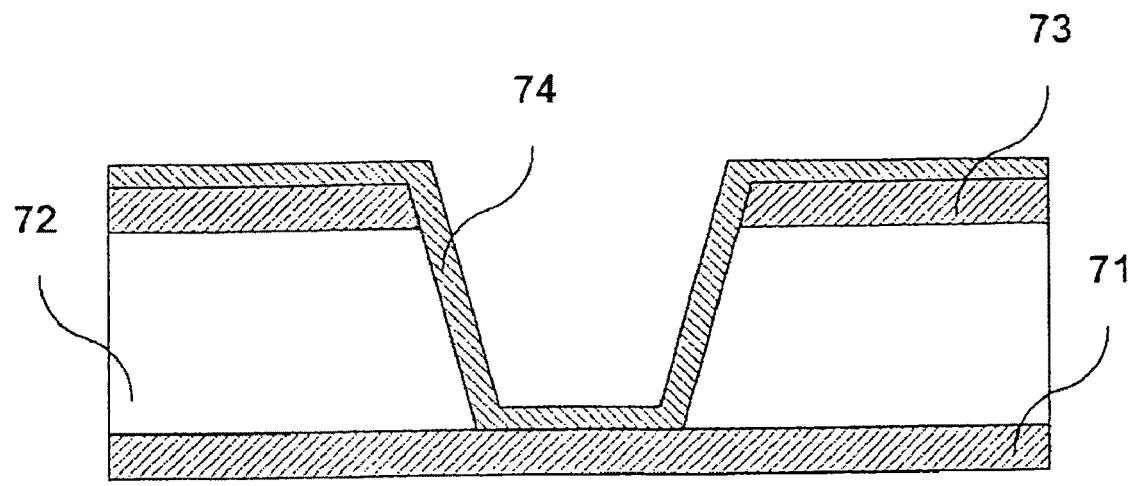

Second, a first plated layer 74 is formed on the first via-hole and on the thin copper layer 73 attached to the top surface of the first laminated copper sheet 72, as shown in FIG. 9b. The first plated layer 74 is preferably formed by P/N plating (CAP plating).

Figure 9C:
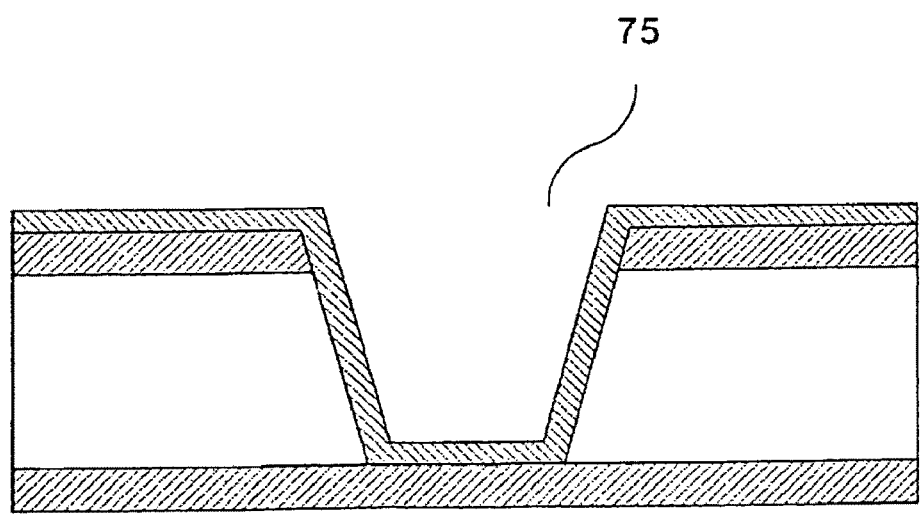

Third, the first plated via-hole is filled with a filling material 75, as shown in FIG. 9c. The filling material 75 is filled in the first plated via-hole by a screen printing process. Preferably, the filling material 75 may be liquefied insulating resin or conductive paste (copper paste or silver paste).

Figure 9D:
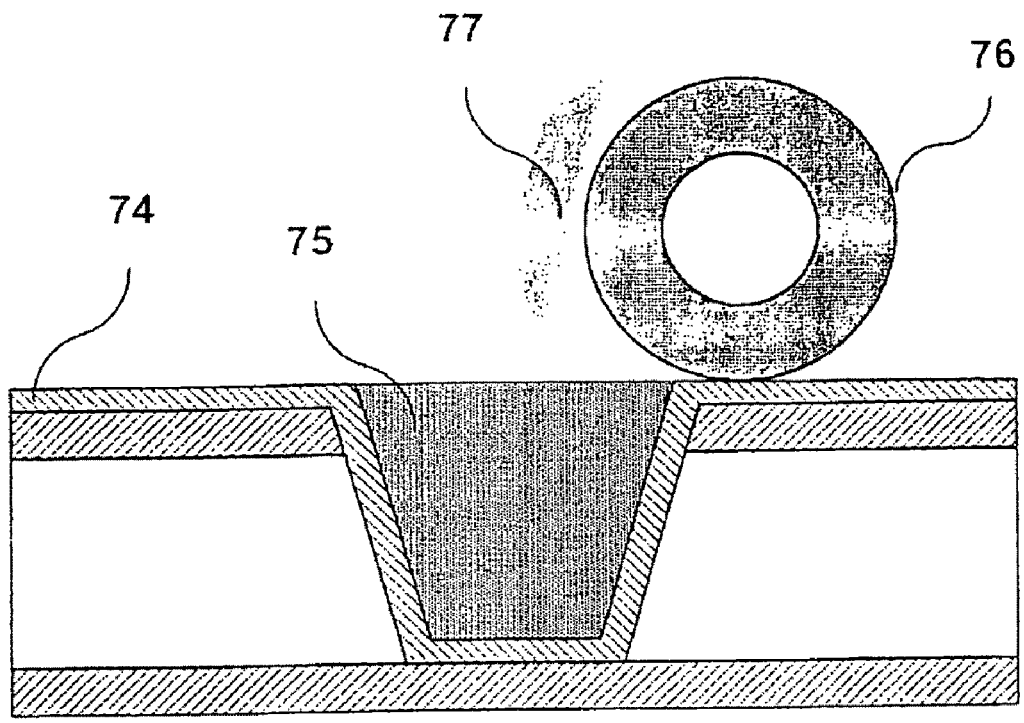

Fourth, the top surface of the first via-hole filled with the filling material 75 is ground by a grinder 76 made of ceramic buff, scotch buff or other grinders, so that the top surface of the first via-hole filled with the filling material 75 is leveled, as shown in FIG. 9d.

Figure 9E:
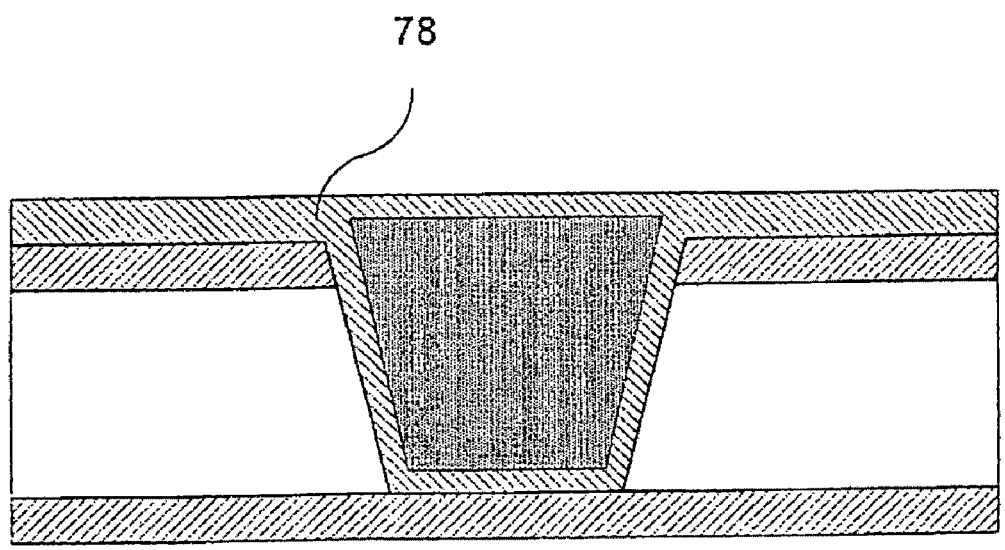

Fifth, a second plated layer 78 is formed on the first leveled via-hole and the copper plated layer 74 so that the first leveled via-hole is covered with the second plated layer 78, as shown in FIG. 9e.

Figure 9F:
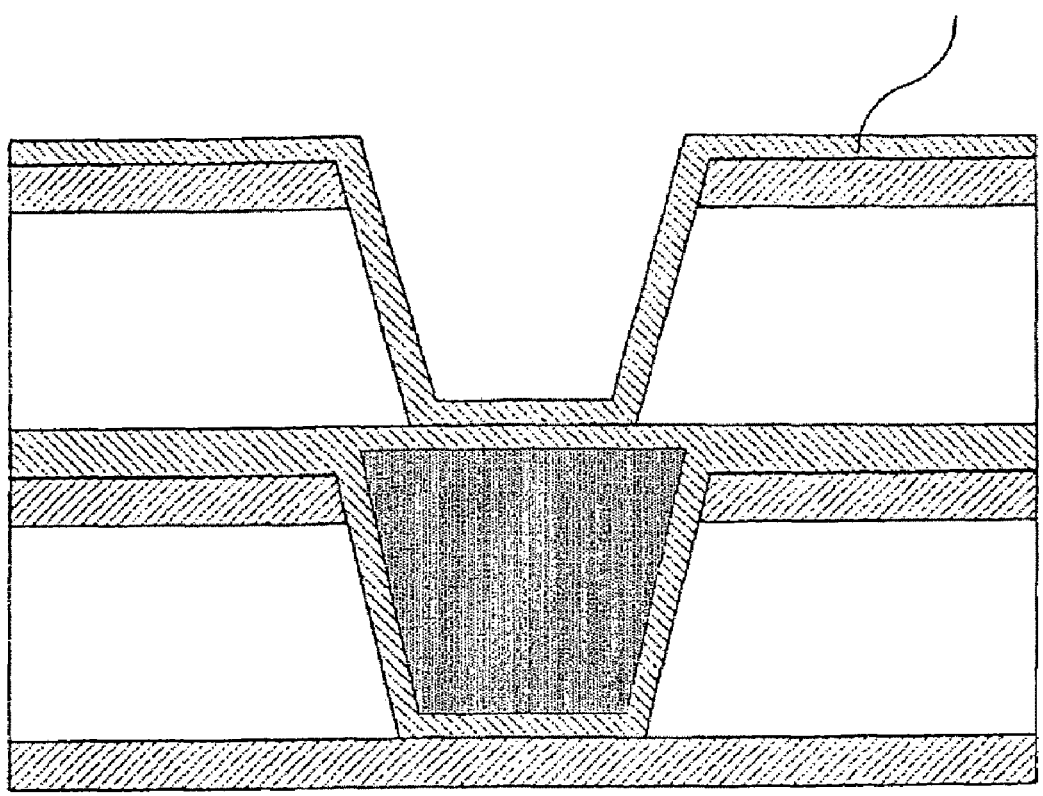

Sixth, a second laminated copper sheet is formed on the second plated layer 78, a second via-hole is formed through the second laminated copper sheet by means of the laser drill, and a third plated layer 79 is formed on the second via-hole and on the second laminated copper sheet, as shown in FIG. 9f.

Figure 9G:
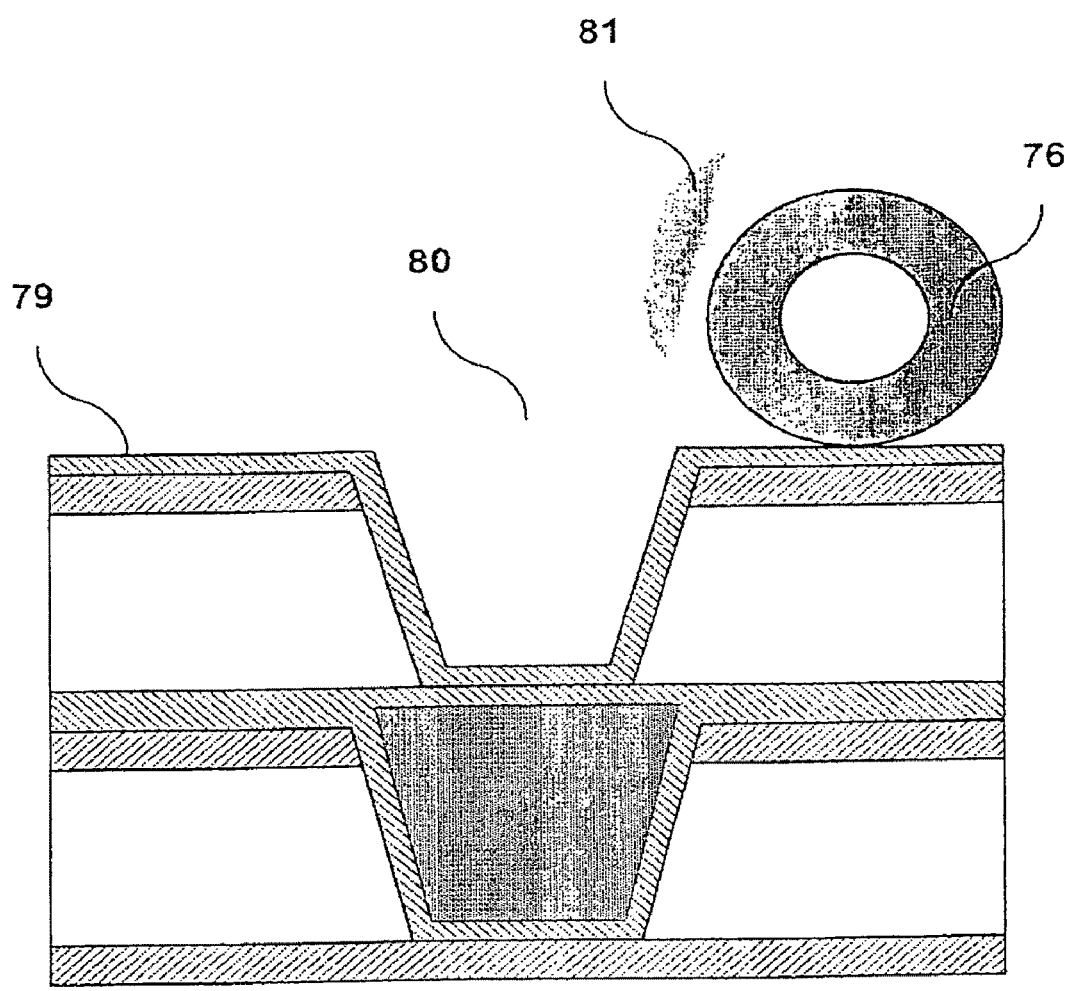

Seventh, the second plated via-hole is filled with another filling material 80, and the top surface of the second via-hole filled with the filling material 80 is ground by the grinder 76 made of ceramic buff, scotch buff or other grinders, so that the top surface of the second via-hole filled with the filling material 80 is leveled, as shown in FIG. 9g. Unexplained reference numerals 77 and 81 indicate surplus filling materials removed from the top surfaces of the first and second via-holes filled with the filling materials 75 and 80, respectively.

When the filling material is filled in the micro via-hole, on which the plated layer is formed, a viscosity of the filling material is set to not more than 100 dPa·s. The filling material is filled in the micro via-hole by a general screen printing machine. The screen printing machine preferably has a screen of not more than 250 mesh of a poly or stainless steel (SUS) sheet.

Preferably, a rubber squeegee spreading speed may be set to not more than 150 mm/sec when the screen printing machine is operated.

After the via-hole is filled with the via-hole filling material, it is firstly dried at a low temperature of 60 to 80° C. for 15 to 30 minutes, and secondly dried at a high temperature of 140 to 160° C. for 30 to 60 minutes.

Preferably, the via-hole formed by the laser drill has a diameter of 50 µm to 200 µm.

Figure 9H:
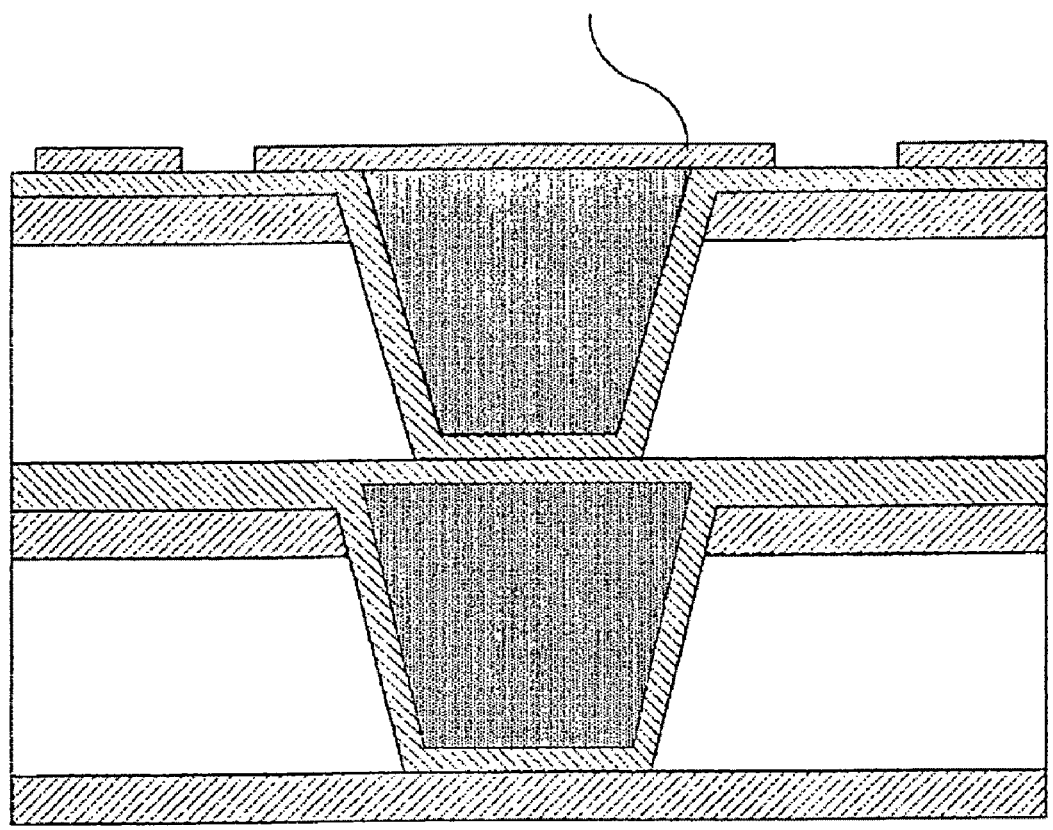

Finally, a fourth plated layer is formed on the second leveled via-hole and the third plated layer 79 so that the second leveled via-hole is covered with the fourth plated layer, as shown in FIG. 9h.

The second laminated sheet may be made of resin coated clad (RCC), copper clad laminate (CCL), prepreg (PRG), or thermal curable (TC) resin.

Preferably, the diameter of the top surface of the via-hole is approximately 100 µm.

Figure 10A:
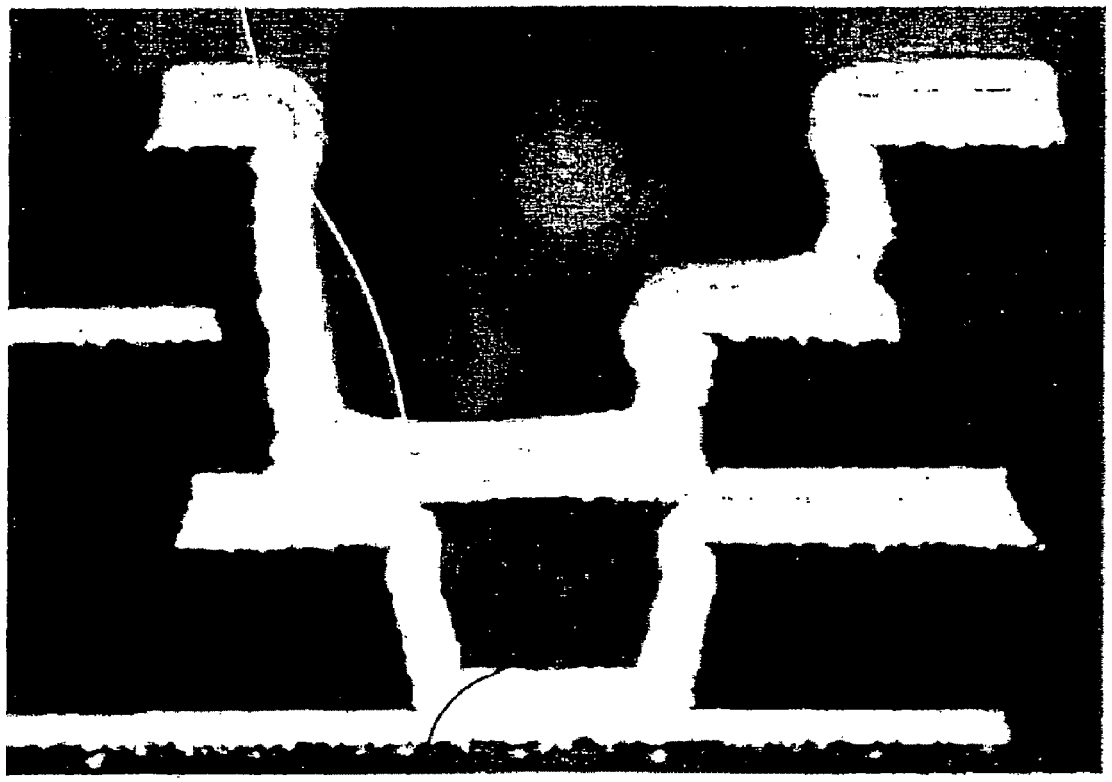
FIGS. 10a to 10c are photographs respectively showing micro via-holes of a printed circuit board manufactured by a build-up process according to the present invention.
Figure 10B:
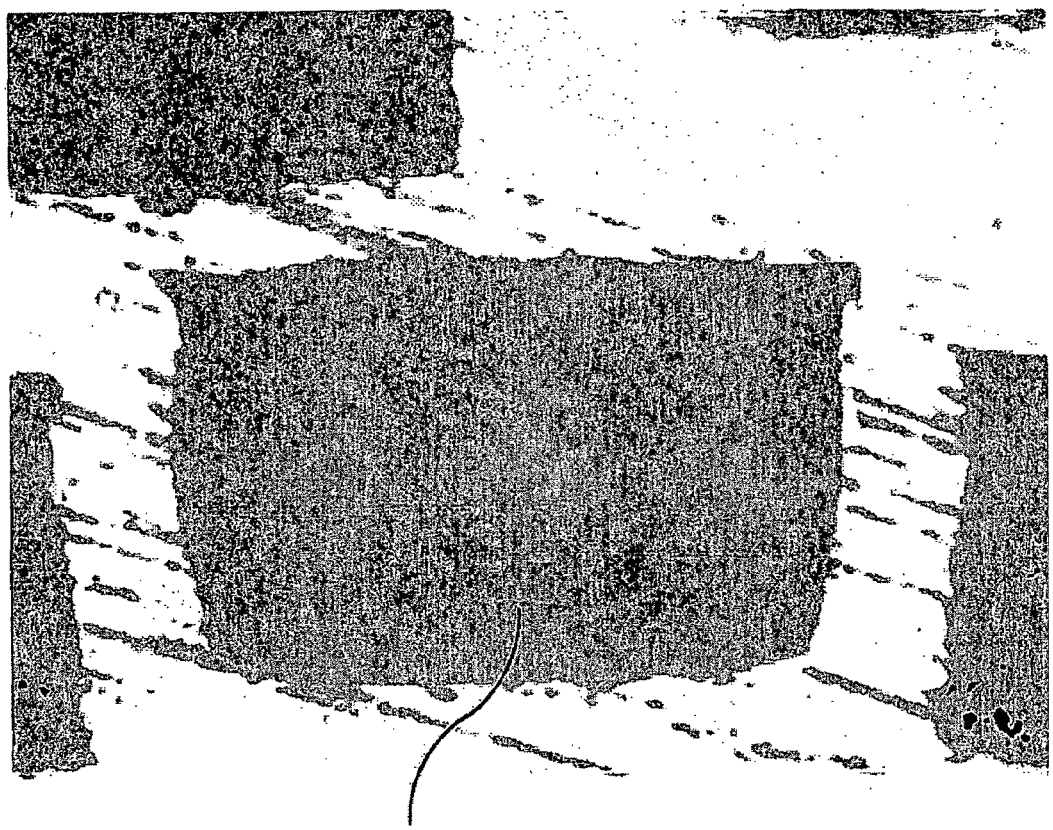
Figure 10C:
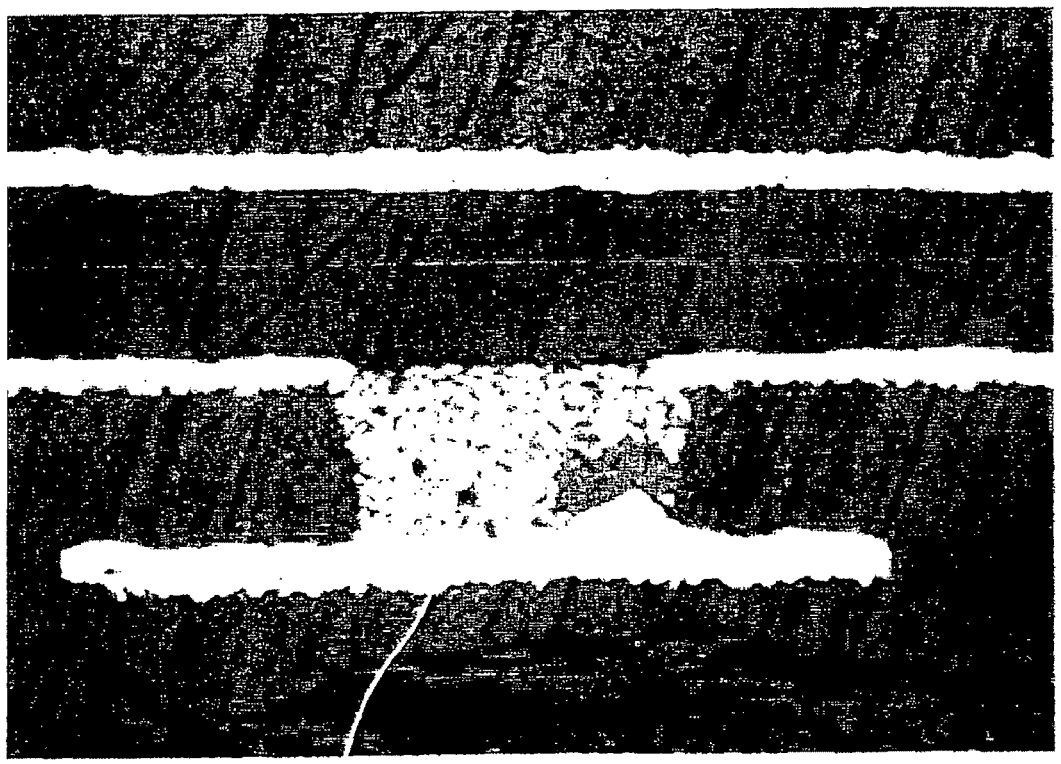

FIGS. 10a to 10c are photographs respectively showing micro via-holes of a printed circuit board manufactured by a build-up process according to the present invention. A micro via-hole is filled with liquefied insulating resin 65, and then another via-hole 66 is formed on the liquefied insulating resin 65, as shown in FIG. 10a. The micro via-hole filled with the liquefied insulating resin 65 is enlarged, as shown in FIG. 10b. The micro via-hole is filled with conductive paste 67 instead of the liquefied insulating resin 65 of FIG. 10a, as shown in FIG. 10c.

Figure 11A:
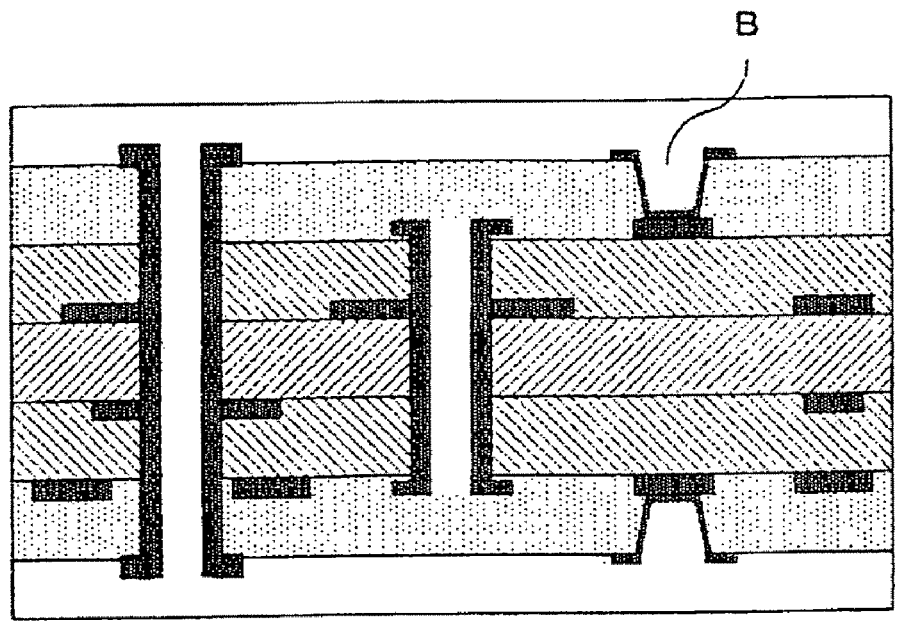
FIGS. 11a to 11c are cross sectional views respectively illustrating the difference between the conventional art and the present invention.
Figure 11B:
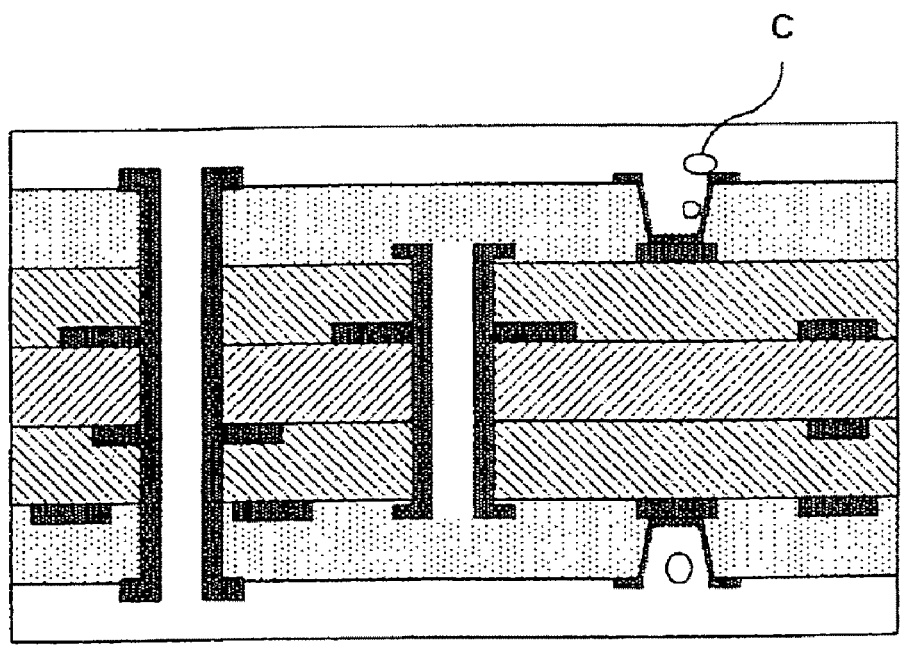
Figure 11C:
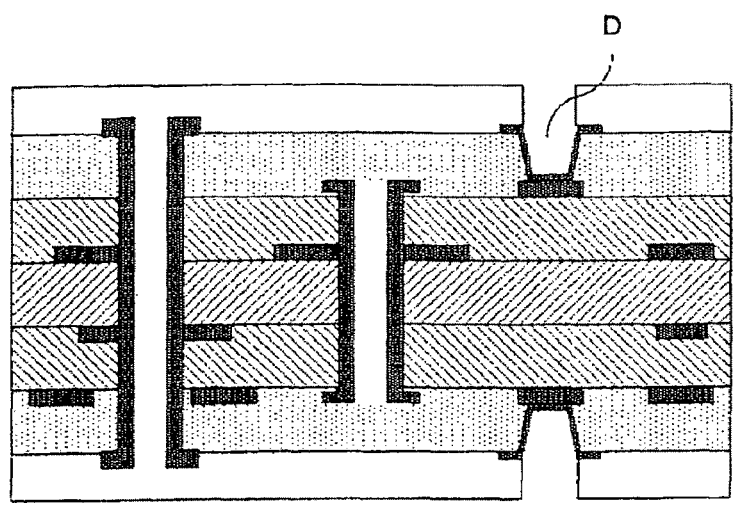

FIGS. 11a to 11c are cross sectional views respectively illustrating the difference between the conventional art and the present invention.

According to the conventional art in which a plated layer is formed on a via-hole, which has been already formed through an outer layer of a printed circuit board by a laser drill, by means of P/N plating (CAP plating), and then a filling material is filled in the plated via-hole, photosensitive photo solder resist ink B may sink, as shown in FIG. 11a. Otherwise, air voids C may be formed in the via-hole, as shown in FIG. 11b. A vacuum screen printing machine is used to solve the aforesaid problems in the conventional prior art.

According to the present invention, a via-hole D formed by a laser drill is evenly filled with a filling material without sinking of the photosensitive photo solder resist ink and occurrence of the air voids. Consequently, the reliability of a printed circuit board manufactured by the present invention is improved.

Figure 12A:
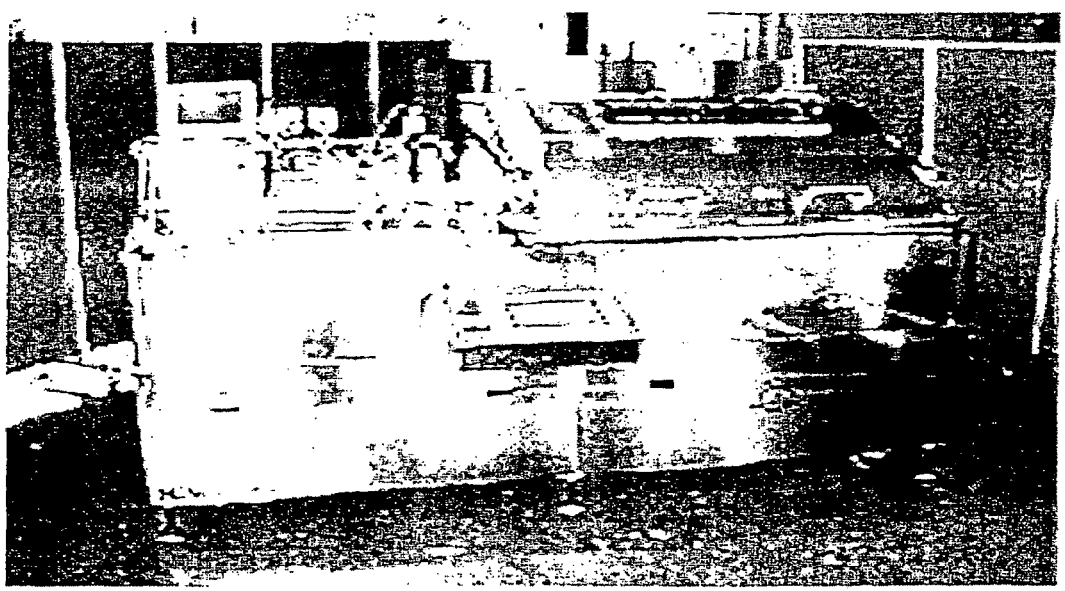
FIG. 12a is a photograph showing a vacuum screen printing machine.
Figure 12B:
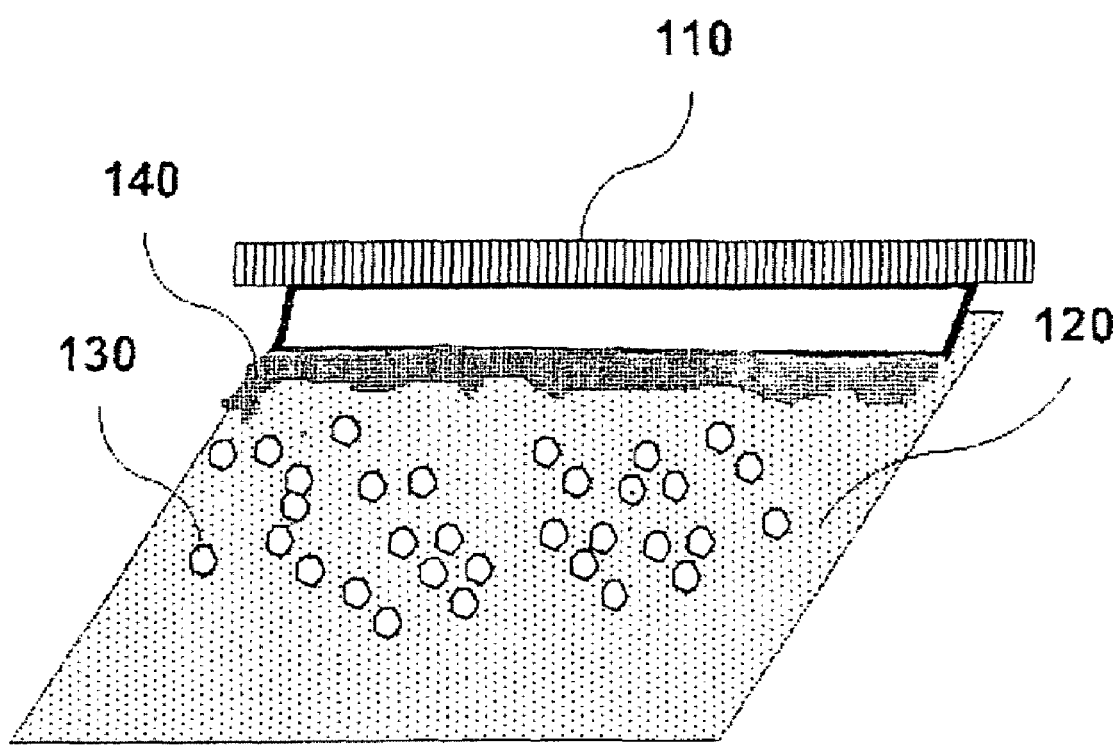
FIG. 12b is a schematic view showing a general screen printing system.

FIG. 12a is a photograph showing a vacuum screen printing machine, and FIG. 12b is a schematic view showing a general screen printing system. The vacuum screen printing machine of FIG. 12a is used for a vacuum screen printing process, and the screen printing machine of FIG. 12b is used for a general screen printing process.

According to the present invention, a via-hole filling material, such as liquefied insulating resin or conductive paste, is filled in a via-hole using a poly screen of the general screen printing machine. The conventional art requires the vacuum screen printing machine, which is very expensive, to fill the via-hole filling material in the via-hole. On the other hand, the present invention uses the general screen printing machine to fill the via-hole filling material in the via-hole.

Reference numeral 110 of FIG. 12b indicates a screen printing machine, reference numeral 120 indicates a printed circuit board, reference numeral 140 indicates a filling material, for example, liquefied insulating resin, and reference numeral 130 indicates via-holes each to be filled with the filling material 140.

According to the present invention, a micro via-hole is formed by a laser drill, only the micro via-hole is filled with liquefied insulating resin or conductive paste by a screen printing process, and then another via-hole is formed above the filled via-hole, so that a built-up printed circuit board with stacked via-holes is manufactured.

As apparent from the above description, the present invention provides a built-up printed circuit board with stacked via-holes, which can be manufactured using the existing facilities and processes without the provision of new facilities. According to the present invention, a filling material, such as liquefied insulating resin or conductive paste, is filled only in the micro via-hole by a screen printing process, thereby reducing the amount of consumption of the liquefied insulating resin or the conductive paste and thus the cost of manufacturing the built-up printed circuit board.

Furthermore, no dimple is formed in the micro via-hole, which is formed in a plating and filling process of the conventional art, and the top surface of the filled micro via-hole is flat. In addition, scale change of the printed circuit board due to bending and expansion/contraction of the printed circuit board, which occurs during the plating and filling process of the conventional art, is very little.

Moreover, the cost incurred for plating and filling process, which is very high, is reduced, and the manufacturing process can be easily and accurately carried out regardless of the size and thickness of the printed circuit board, and the size and the shape of the via-hole to be filled with the filling material.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. A built-up printed circuit board with stack type via-holes, comprising:
- a plurality of first via-holes formed through a first laminated copper sheet by means of a laser drill;
- a first plated layer formed on the first via-holes and the first laminated copper sheet;
- a filling material filled in each of the first plated via-holes;
- a second plated layer formed on the first filled via-holes and the first plated layer to cover the first filled via-holes;
- a plurality of second laminated copper sheets disposed on the second plated layer, respectively; and
- a plurality of second via-holes formed through the second laminated copper sheets by means of the laser drill, wherein the via-hole filling material is liquefied insulating resin.

2. The board as set forth in claim 1, wherein the laser is a $CO_2$ laser or an Nd-YAG laser.

3. The board as set forth in claim 1, wherein the first and second plated layers are formed by means of P/N plating (CAP plating).

4. The board as set forth in claim 1, wherein the via-hole filling material is filled in each of the via-hole by a general screen printing process.

5. The board as set forth in claim 4, wherein portions of a poly screen corresponding to the via-holes are opened so that the via-hole filling material passes through each of the opened portions to fill only the via-holes during the screen printing.

* * * * *